(12) United States Patent
Hsu et al.

(10) Patent No.: US 10,483,232 B2
(45) Date of Patent: Nov. 19, 2019

(54) METHOD FOR FABRICATING BUMP STRUCTURES ON CHIPS WITH PANEL TYPE PROCESS

(71) Applicant: Phoenix Pioneer Technology Co., Ltd., Hsinchu County (TW)

(72) Inventors: Shih-Ping Hsu, Hsinchu County (TW); Che-Wei Hsu, Hsinchu County (TW); Tung-Yao Kuo, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/683,944

(22) Filed: Aug. 23, 2017

(65) Prior Publication Data

US 2019/0067242 A1 Feb. 28, 2019

(51) Int. Cl.
*H01L 23/00* (2006.01)
*H01L 23/538* (2006.01)
*H01L 21/48* (2006.01)
*H01L 21/56* (2006.01)

(52) U.S. Cl.
CPC .......... *H01L 24/96* (2013.01); *H01L 21/4853* (2013.01); *H01L 21/4857* (2013.01); *H01L 21/561* (2013.01); *H01L 23/5383* (2013.01); *H01L 24/03* (2013.01); *H01L 24/05* (2013.01); *H01L 24/11* (2013.01); *H01L 24/13* (2013.01); *H01L 24/19* (2013.01); *H01L 2224/03464* (2013.01); *H01L 2224/0401* (2013.01); *H01L 2224/04105* (2013.01); *H01L 2224/05082* (2013.01); *H01L 2224/05083* (2013.01); *H01L 2224/05084* (2013.01); *H01L 2224/05124* (2013.01); *H01L 2224/05144* (2013.01); *H01L 2224/05147* (2013.01); *H01L 2224/05155* (2013.01); *H01L 2224/05164* (2013.01); *H01L 2224/10126* (2013.01); *H01L 2224/11464* (2013.01); *H01L 2224/11618* (2013.01); *H01L 2224/12105* (2013.01); *H01L 2224/13026* (2013.01); *H01L 2224/13147* (2013.01); *H01L 2224/214* (2013.01); *H01L 2224/32245* (2013.01); *H01L 2224/73267* (2013.01); (Continued)

(58) Field of Classification Search
CPC ....... H01L 2924/00014; H01L 2924/00; H01L 2224/13111; H01L 2924/00012; H01L 2924/014
See application file for complete search history.

(56) References Cited

U.S. PATENT DOCUMENTS 6,177,731 B1 * 1/2001 Ishida ................... H01L 21/563
257/772
2016/0027747 A1 * 1/2016 Ryu ........................ H01L 24/05
257/737
2016/0365324 A1 * 12/2016 Kim ...................... H01L 21/486

* cited by examiner

*Primary Examiner* — Tony Tran
(74) *Attorney, Agent, or Firm* — McClure, Qualey & Rodack, LLP

(57) ABSTRACT

A method for fabricating bump structures on chips with a panel type process is provided. First, a panel type substrate is provided. Semiconductor chips are fixed on the panel type substrate. Each semiconductor chip includes metal pads and a passivation layer exposing the metal pads. At least an electroless plating process is performed to form under bump metallurgy structures on the metal pads. The method simplifies the processes of forming electrical connections for semiconductor chips. The panel type process can effectively increase the yield, and reduce the manufacturing cost.

12 Claims, 8 Drawing Sheets

(52) U.S. Cl.
CPC ............... *H01L 2224/82039* (2013.01); *H01L 2924/18162* (2013.01)

METHOD FOR FABRICATING BUMP STRUCTURES ON CHIPS WITH PANEL TYPE PROCESS

BACKGROUND

1. Technical Field

The present invention relates to a method for fabricating bump structures on semiconductor chips, in particular, to a method for fabricating under bump metallurgy structure (UBM structure) with panel type process.

2. Description of Related Art

Assembly mainly provides the functions such as integrated circuit protection, heat dissipation and circuit conducting, of which a wafer bumping process is usually applied to the flip chip. In advance of wafer stage, the UBM structure is formed on the external metal welding pad of the wafer, bumps are formed on the UBM structure, then the wafer is incised into multiple independent semiconductor chips. The semiconductor chip is connected to a package substrate through the bumps and then packaged with resin.

Refer to FIG. 1 to FIG. 6, wherein FIG. 1 is a schematic diagram of prior wafer bump fabrication process, and FIG. 2 to FIG. 6 are diagrammatic cross-sections of prior wafer bump fabrication process. As shown in FIG. 1, the prior UBM structure process is executed at the wafer stage, and a wafer 10 is provided firstly. As shown in FIG. 2, the wafer 10 includes the protecting layer 12 and electrode pad 14.

Next, as shown in FIG. 3, a coater is used to coat a polyimide layer 15 (PI layer) evenly on the wafer with spin coating, and then it is finalized into a film via soft bake on a hot plate. Then the UV exposure process is carried out, a photomask is used to cover the position of a predetermined via hole of the PI layer 15 without exposure to the light (the position of via hole are above the electrode pad 14). Later, the development process is executed, wherein the developing solution is used to remove the unexposed area by spray, and then titanium deposition is made by sputtering coating as an UBM structure 16.

Afterwards, a patterned photoresistance layer 18 (FIG. 4) is formed via photoresist coating process, exposure process and development process. Thereafter, a copper plate 20 (FIG. 5) with thick deposition is electroplated in the via hole of the patterned photoresistance layer 18. After that, the patterned photoresistance layer 18 is stripped first, and then the undesired UBM structure 16 is etched. Finally, the desired metal bump 22 (FIG. 6) is gained through photoresist coating, exposure, development, metal plating and resist strip process (not shown in the figure).

However, the UBM structure 16 and the metal bump 22 formed on the wafer 10 are processed with wafer size, its output is restricted by the wafer size, and the process is also complex, thus, its productivity is poor with slow output and high processing cost.

Therefore, it is an important subject to provide a method for fabricating UBM structure using electroless plating to develop a process to resolve various defects of the prior art above-mentioned, in order to promote the yield of products and reduce the fabrication cost.

SUMMARY OF THE INVENTION

In view of the foregoing, the present invention is to provide a method for fabricating UBM structure using electroless plating with panel type process that can simplify the process and reduce the fabrication cost.

To achieve the above, the invention is to provide a method for fabricating bump structures on chips with panel type process. Firstly, an integrated carrier and a plurality of semiconductor chips are provided. The semiconductor chip has the active side and the reverse side relative to the active side. The active side has a plurality of metal electrode pads and an insulated protecting layer. The insulated protecting layer is exposed out of the metal electrode pad. Secondly, the reverse side is fixed on the integrated carrier. Thirdly, an electroless plating process is executed to form an UBM structure on the metal electrode pad of the semiconductor chip. Fourthly, a dielectric layer is formed to cover on the integrated carrier, the semiconductor chip and the UBM structure. Fifthly, a plurality of via holes are formed in the dielectric layer and are exposed out of the UBM structure. Finally, a plurality of metal bumps are formed in the via holes of the dielectric layer.

Therefore, the method for fabricating bump structures on chips with panel type process is to form the electroless plating UBM structure directly on the metal electrode pad of the semiconductor chip through convenient and efficient electroless plating process, thus it can simplify the electrical connection machining process of semiconductor chip, is easily implemented, and can reduce high-cost processes like electroplating and patterning, thereby, to achieve the role of reducing the fabrication cost.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

FIGS. 8 to 13 are schematic diagrams of the UBM structure and metal bump fabricated with panel type process according to the first embodiment of the invention, wherein, FIG. 9 is a vertical view of FIG. 8, and the rest are diagrammatic cross-section diagrams.

DETAILED DESCRIPTION

Reference will now be made to the drawings to describe various inventive embodiments of the present disclosure in detail, wherein like numerals refer to like elements throughout.

Figure 1:
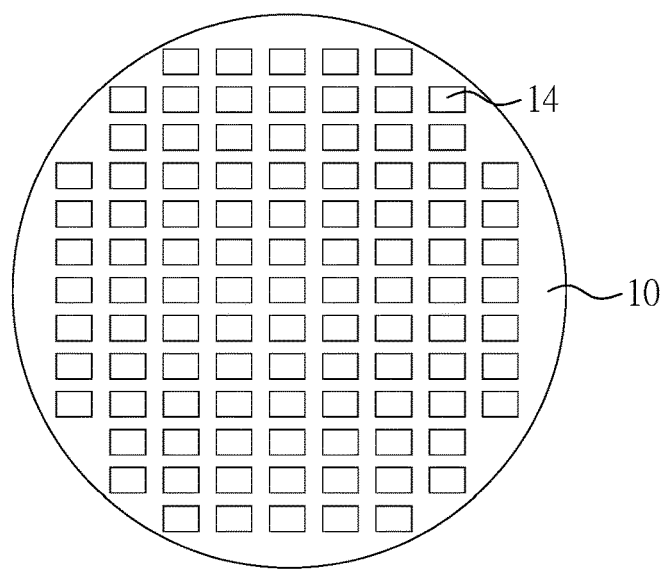
FIG. 1 is a schematic diagram of prior wafer bump fabrication process.
Figure 2:
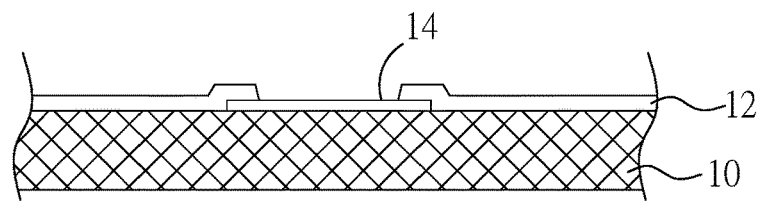
FIGS. 2 to 6 are diagrammatic cross-section diagrams of prior wafer bump fabrication process.
Figure 3:
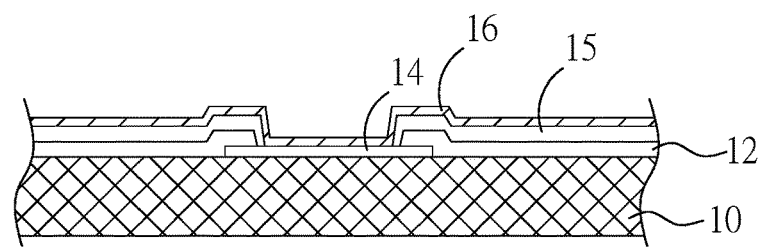
Figure 4:
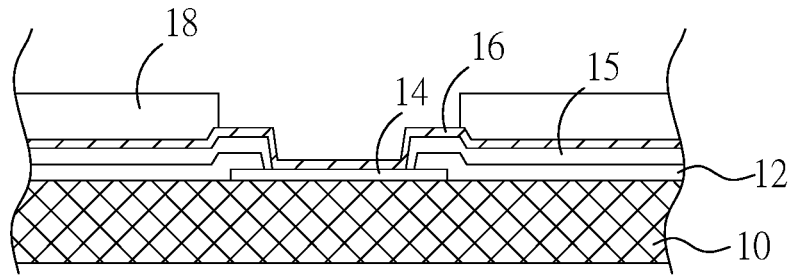
Figure 5:
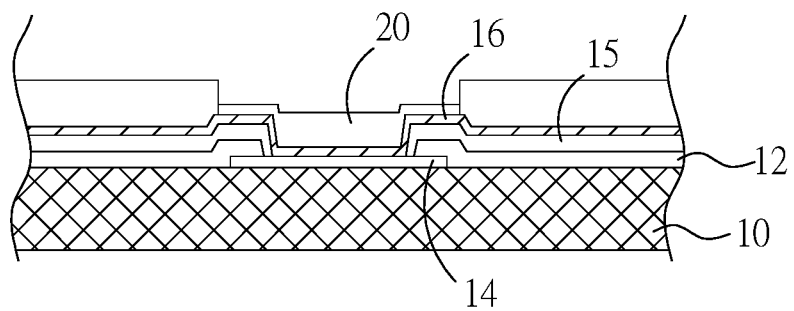
Figure 6:
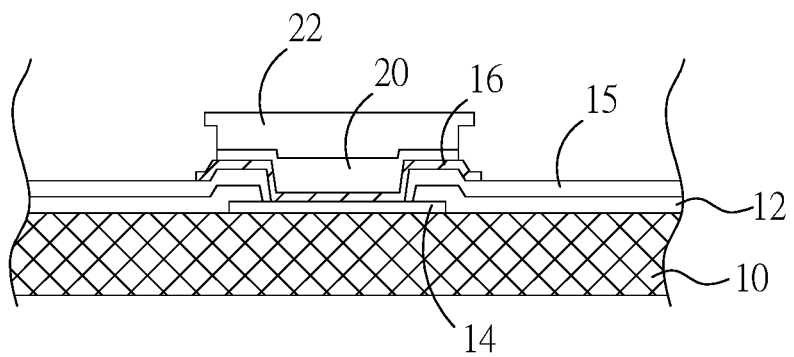
Figure 7:
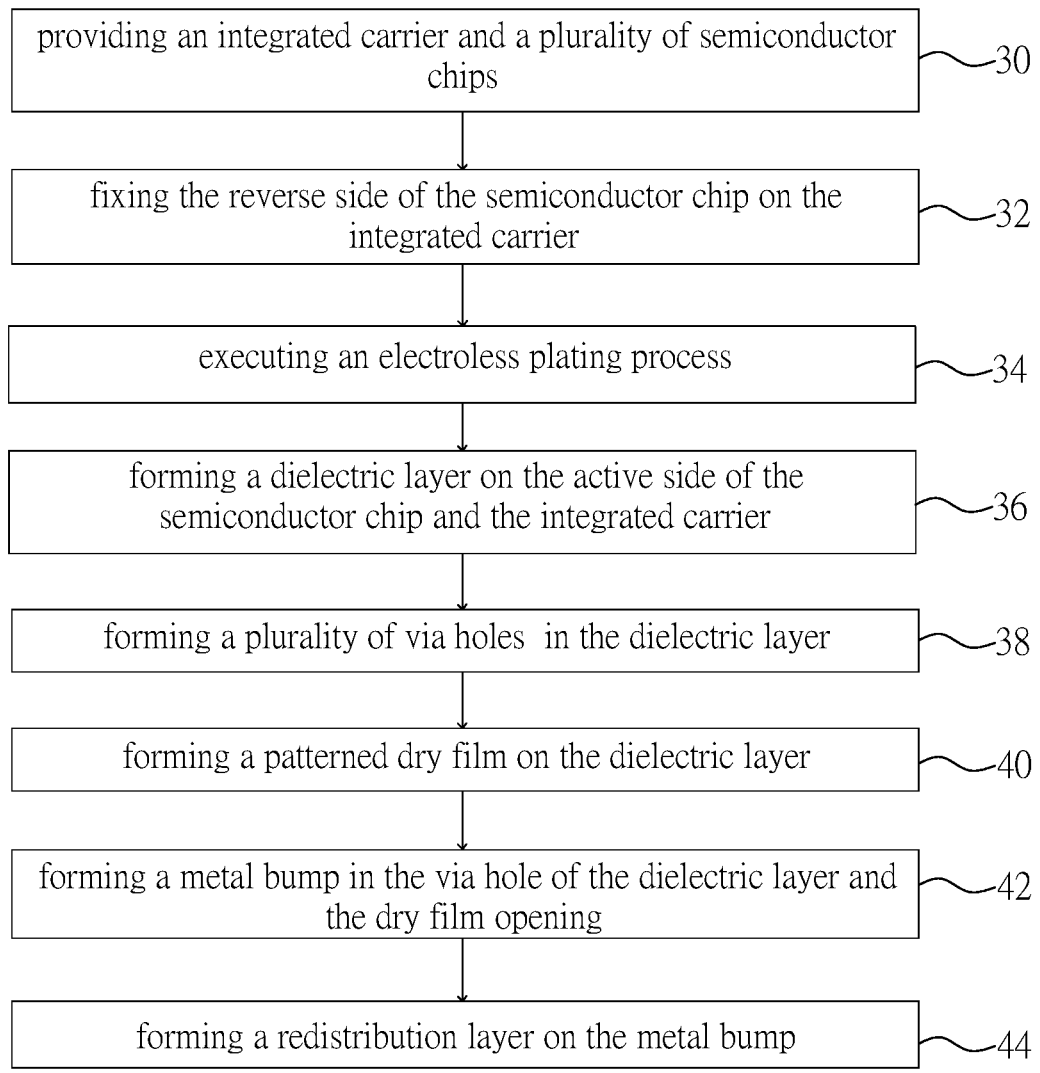
FIG. 7 is a flow chart of a method for fabricating UBM structure and metal bump with panel type process of the invention.
Figure 8:
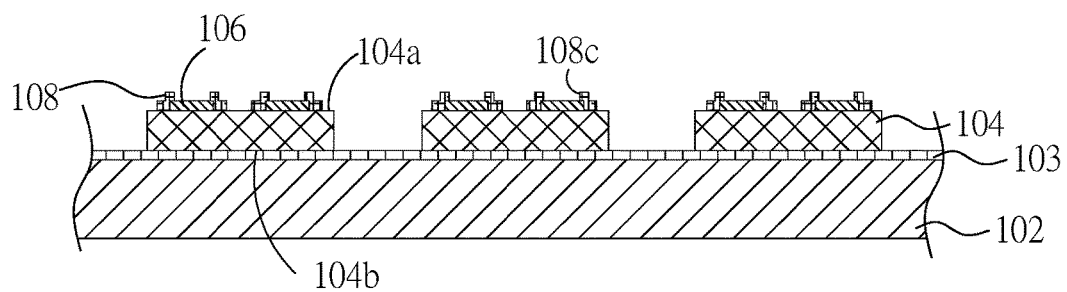
Figure 9:
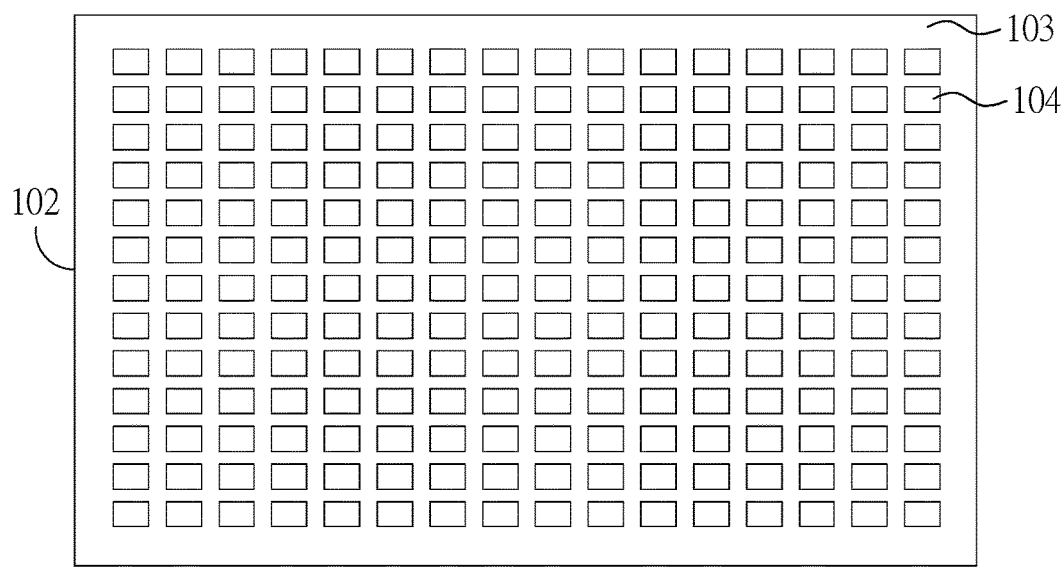

Refer to FIGS. 7 to 13, wherein FIG. 7 is a flow chart showing a method for fabricating UBM structure and metal bump with panel type process. FIGS. 8 to 13 are schematic diagrams of UBM structure and metal bump fabricated with panel type process according to the first embodiment of the invention. FIG. 9 is a vertical view of FIG. 8. As shown in Step 30 of FIG. 7, FIG. 8 and FIG. 9, an integrated carrier 102 and a plurality of semiconductor chips 104 are provided first.

The integrated carrier 102 can be a metal plate or an insulating plate, wherein the material of the metal plate can be metallic copper material. The insulating plate can be made of epoxy resin, polyimide, cyanate ester, carbon fiber or hybrid glass fiber and epoxy resin, etc. The semiconductor chips 104 can be active or passive semiconductor chips, which are divided after various passive components, active components and connecting structures are fabricated on the whole wafer. The semiconductor chip 104 may include a capacitor silicon chip, a memory chip or a CPU chip, etc., and has an active side 104a and a reverse side 104b relative to the active side 104a. The active side 104a has a plurality of metal electrode pads 106, e.g. aluminum metal electrode pads or copper metal electrode pads. An insulated protecting layer 108 has formed in advance on the active side 104a to cover the metal electrode pads 106. The insulated protecting layer 108 can be made of benzo-cyclo-butene (BCB), polyimide or other dielectric materials.

At least one opening is processed for the insulated protecting layer 108 via plasma etching, reactive ion etching (RIE) or laser etching, in this way, the opening 108c is formed in the insulated protecting layer 108. The opening 108c is corresponding to the position of the metal electrode pad 106 to expose the metal electrode pad 106.

Then, as shown in Step 32 of FIG. 7, FIG. 8 and FIG. 9, the reverse side 104b of the semiconductor chip 104 is fixed on the integrated carrier 102. The process for fixing the semiconductor chip 104 may include attaching a coating film 103 on an upper surface of the integrated carrier 102 and then connecting and placing the semiconductor chip 104 above the coating film 103.

Figure 10:
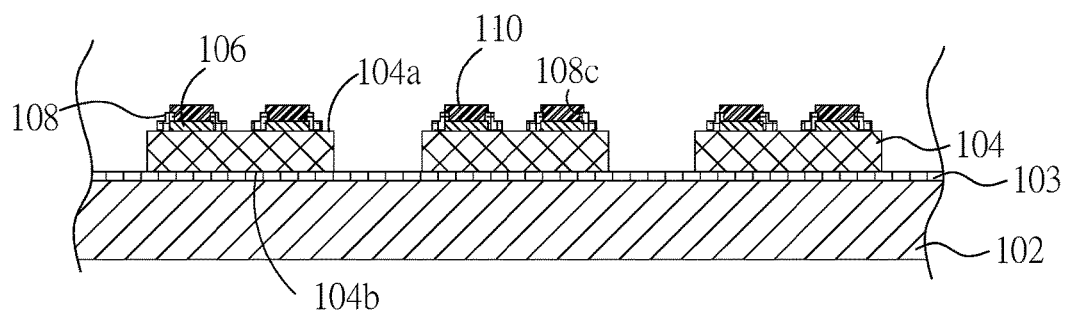

Next, as shown in Step 34 of FIG. 7 and FIG. 10, an electroless plating process is executed to form the self-aligned UBM structure 110 on the metal electrode pad 106 of the semiconductor chip 104, and thus to complete the electrical connection machining process on the semiconductor chip 104.

The electroless plating, as an autocatalytic chemical treatment technology, is to form a metal-layer deposition on the surface of a plated metal of the object to be plated. The electroless plating is to expose or soak the object to be plated into the chemical solution, which includes the reductant and deposited metal material. The reductant can react with metal ions of deposited metal material and plated metal to form metal-layer deposition on the exposed part of the plated metal, based on which UBM structure 110 can be formed in the electroless plating by means of self-alignment.

The UBM structure 110, as the interface between the metal electrode pad 106 and subsequent bump, is characterized by low stress, good adhesion, strong corrosion resistance, good copper and tin dipping property, etc., In the embodiment, the UBM structure 110 is to deposit copper, nickel, palladium, gold or their combination on the metal electrode pad 106 in a way of electroless plating. Because the metal electrode pad 106 is also the metal material of the same or similar property, the electroless plating UBM structure 110 can be directly formed and be firmly bound on the metal electrode pad 106, besides, the metal electrode pad 106 can be protected by the UBM structure 110 to avoid being polluted. In other embodiments, the UBM structure 110 can be made of copper, aluminum, nickel, titanium, tin, palladium, their combination or other similar elements.

Figure 11:
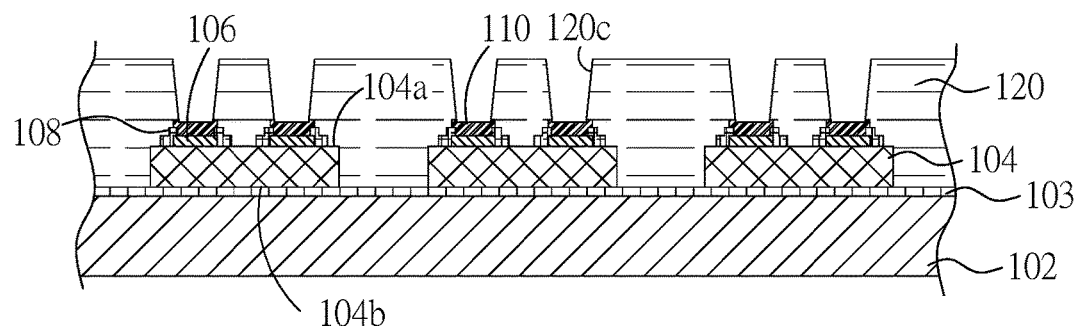

As shown in Step 36 and Step 38 of FIG. 7 and FIG. 11, a dielectric layer 120 is formed on the active side 104a of the semiconductor chip 104 and the integrated carrier 102 in Step 36 to cover on the integrated carrier 102, the semiconductor chip 104 and the UBM structure 110. The dielectric layer 120 can be filled on the surface of the integrated carrier 102 between the semiconductor chips 104, to increase the protection for the semiconductor chip 104, and firmly fix the semiconductor chip 104 on the integrated carrier 102.

A plurality of via holes 120c is formed in the dielectric layer 120 in Step 38, and the UBM structure 110 is exposed out of the via hole 120c. The via hole 120c is formed on the surface of the dielectric layer 120 through laser drill, exposure, development or other processes, to reveal the UBM structure 110 on the semiconductor chip 104.

In the embodiment, the dielectric layer 120 can be a sealant material layer, e.g. epoxy molding compound (EMC) (also called solid encapsulating material), while the steps for forming the via hole 120c include the laser drill process for the sealant material layer. Steps for forming the sealant material layer include placing the packaging glue into the mold, heating the packaging glue into liquid type and injecting the packaging glue with liquid type into the mold cavity with the semiconductor chip 104 and the integrated carrier 102 via pouring gate and sprue to complete the molding process, and then bake process is executed to solidify the sealant material layer.

In the embodiment, epoxy molding compound is one of the high filler content dielectric material, which is based on epoxy resin as the main material. In epoxy molding compound, the epoxy resin is about 8 wt. % to 12 wt. % and the filler is about 70 wt. % to 90 wt. %. The filler may include silica and alumina to increase the mechanical strength, reduce the linear thermal expansion coefficient, increase heat conduction, increase water resistance and reduce the effectiveness of rubber overflow.

In other embodiments, the dielectric layer 120 can be a photoresistance layer, and steps for forming the via hole 120c include exposure and development process for the photoresistance layer.

Figure 12:
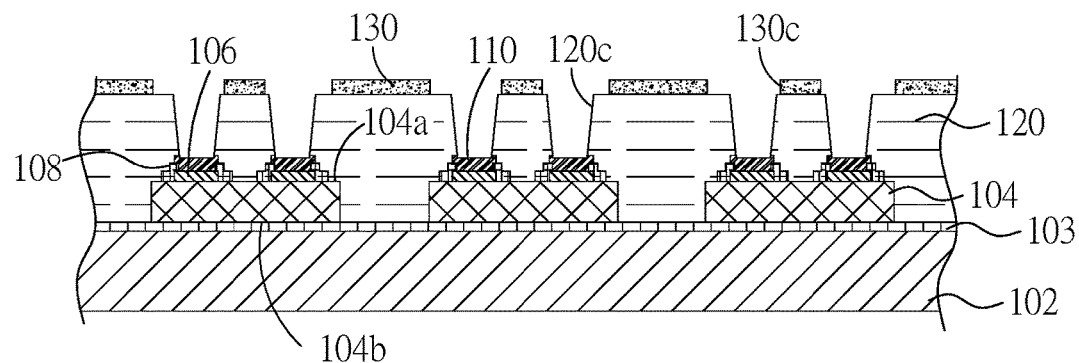

As shown in Step 40 of FIG. 7 and FIG. 12, a patterned dry film 130 is formed on the dielectric layer 120. The patterned dry film 130 includes a plurality of dry film openings 130c to expose the via hole 120c, the UBM structure 110 and a part of the dielectric layer 120.

Figure 13:
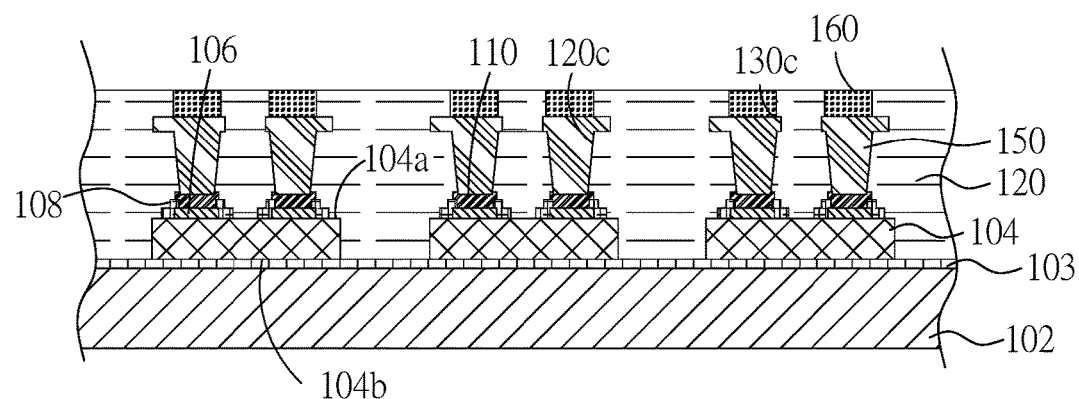

As shown in Step 42 and Step 44 of FIG. 7 and FIG. 13, a metal bump 150 is formed in the via hole 120c of the dielectric layer 120 and the dry film opening 130c in Step 42. Specifically, steps for forming the metal bump 150 include the copper metal plating process to form metal copper layer (not shown in the figure) on the dielectric layer 120 and the patterned dry film 130; then patterned dry film 130 is removed and the excess metal copper is etched to form the metal bump 150.

A redistribution layer (RDL) 160 is formed on the metal bump 150 in Step 44. The RDL 160 is electrically connected to the metal electrode pad 106 of the semiconductor chip 104 through the metal bump 150 and the UBM structure 110, thus leading to electrical extension for the semiconductor chip 104.

The prior art is restricted by the wafer size, so its productivity is poor; oppositely, the present invention adopts the panel type process, which can fix numerous semiconductor chips 104 on the integrated carrier 102 for mass process, therefore, the batch output of the present invention can be the multiple of the prior art, and can greatly promote the efficiency of the process.

Furthermore, relative to the prior art, the present invention adopts electroless plating process to form the UBM structure 110, which can reduce the entire fabrication cost and lead time required by forming the metal bump 150. The electroless plating process is used in the present invention to directly form the self-aligned UBM structure 110, so that no patterned photoresistance layer is required for pattern alignment in this step. Due to the present invention adopts the electroless plating mode to form the self-aligned UBM structure 110 directly on the metal electrode pad 106 of the semiconductor chip 104, therefore, it can simplify the electrical connection machining process of the semiconductor chip 104, is easily implemented, and can reduce high-cost processes like electroplating and patterning, thereby, to achieve the role of reducing the fabrication cost.

The structure of the UBM structure 110 is described in detail, the UBM structure 110 of the present embodiment can be composed of single-layer metal or multilayer metal. In the multilayer metal case, such as an adhesive layer that can increase the associativity of metal and the metal electrode pad 106, a barrier layer that can avoid metal oxidation and a wetting layer that can increase the adhesive force of copper tine bump. The electroless plating process can be electroless nickel-electroless palladium-immersion gold (ENEPIG), electroless nickel-immersion gold (ENIG) or the combination of electroless plating process. Refer to FIGS. 14 to 17, which are diagrammatic cross-sections of the UBM structure fabricated according to the second to the fifth embodiments.

Figure 14:
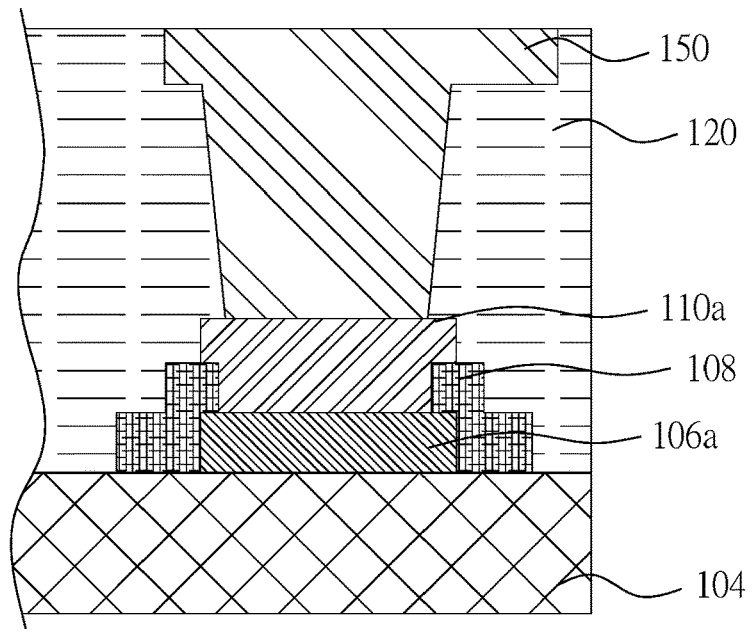
FIGS. 14 to 17 are cross-section diagrams of the UBM structure fabricated according to the second to the fifth embodiments of the invention.

As shown in FIG. 14, the electroless plating process of the second embodiment includes the electroless copper plating process. In the embodiment, the metal electrode pad is a copper metal electrode pad 106a, and the UBM structure is a copper metal layer 110a that the copper metal layer 110a is formed on the cooper metal electrode pad 106a; the order of arrangement from below is respectively the copper metal electrode pad 106a, the copper metal layer 110a and the metal bump 150.

Figure 15:
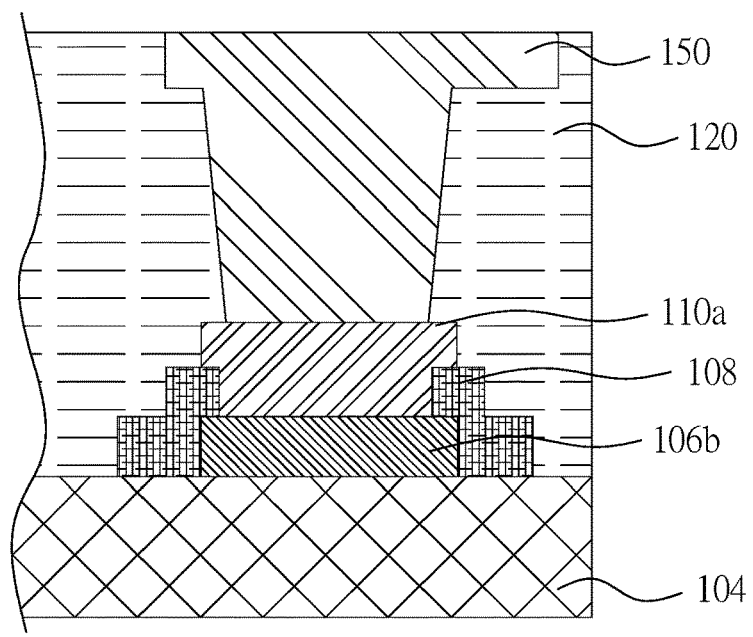

As shown in FIG. 15, the electroless plating process of the third embodiment includes the electroless copper plating process. In the embodiment, the metal electrode pad is an aluminum metal electrode pad 106b, and the UBM structure 110 is a copper metal layer 110a that the copper metal layer 110a is formed on the aluminum metal electrode pad 106b; the order of arrangement from below is respectively the aluminum metal electrode pad 106b, the copper metal layer 110a and the metal bump 150.

Figure 16:
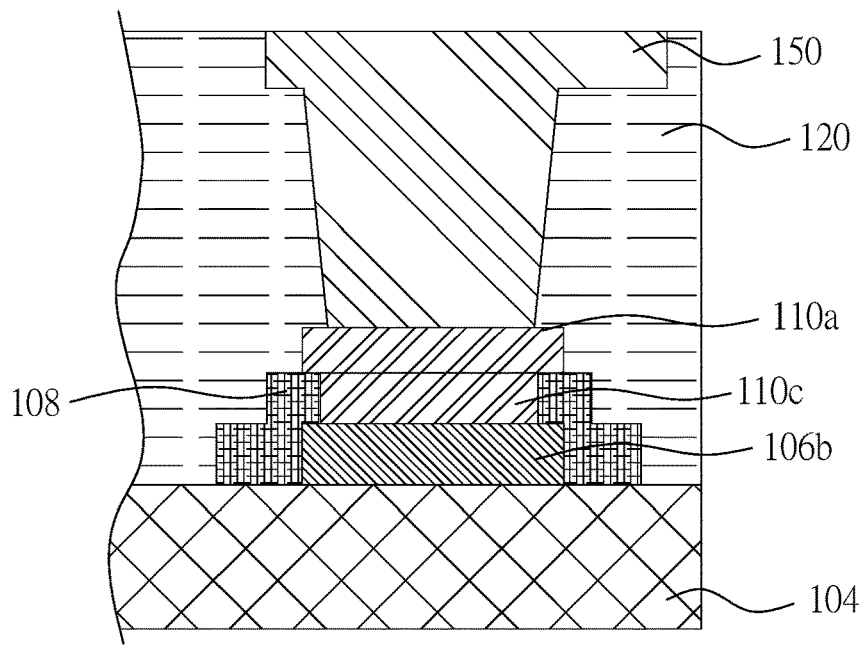

As shown in FIG. 16, the electroless plating process of the fourth embodiment includes the electroless nickel plating process and the electroless copper plating process. In the embodiment, the metal electrode pad is an aluminum metal electrode pad 106b, and the UBM structure 110 includes a nickel mental layer 110c and a copper metal layer 110a that the nickel mental layer 110c is formed on the aluminum metal electrode pad 106b and the copper metal layer 110a is formed on the nickel metal layer 110c; the order of arrangement from below is respectively the aluminum metal electrode pad 106b, the nickel metal layer 110c, the copper metal layer 110a and the metal bump 150.

Figure 17:
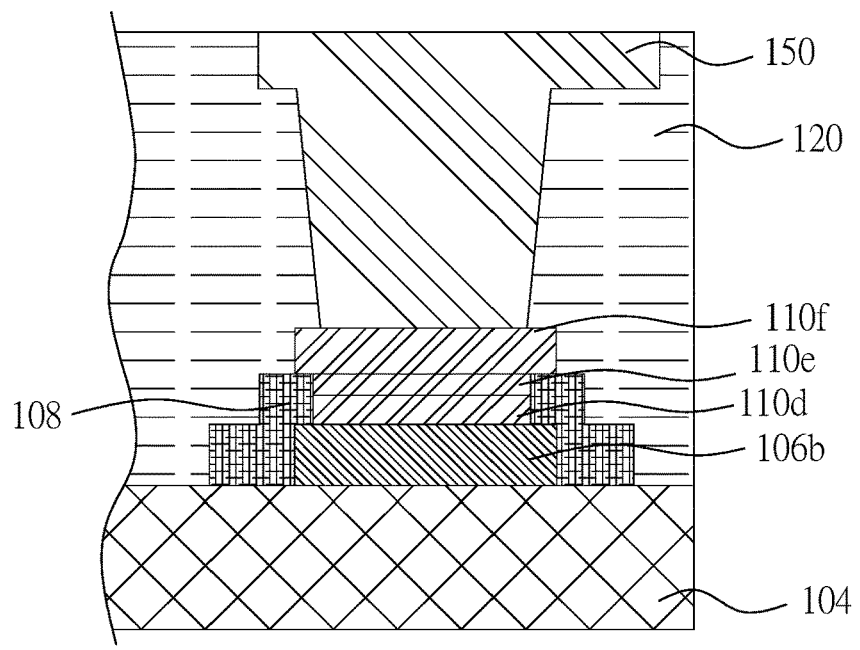

As shown in FIG. 17, the electroless plating process of the fifth embodiment includes a first electroless gold plating process, an electroless palladium plating process and a second electroless gold plating process. In the embodiment, the metal electrode pad is an aluminum metal electrode pad 106b, the UBM structure 110 includes a first gold metal layer 110d, a palladium metal layer 110e and a second gold metal layer 110f that the first gold metal layer 110d is formed on the aluminum metal electrode pad 106b, the palladium metal layer 110e is formed on the first gold metal layer 110d and the second gold metal layer 110f is formed on the palladium metal layer 110e; the order of arrangement from below is respectively the aluminum metal electrode pad 106b, the first gold metal layer 110d, the palladium metal layer 110e, the second gold metal layer 110f and the metal bump 150.

Figure 18:
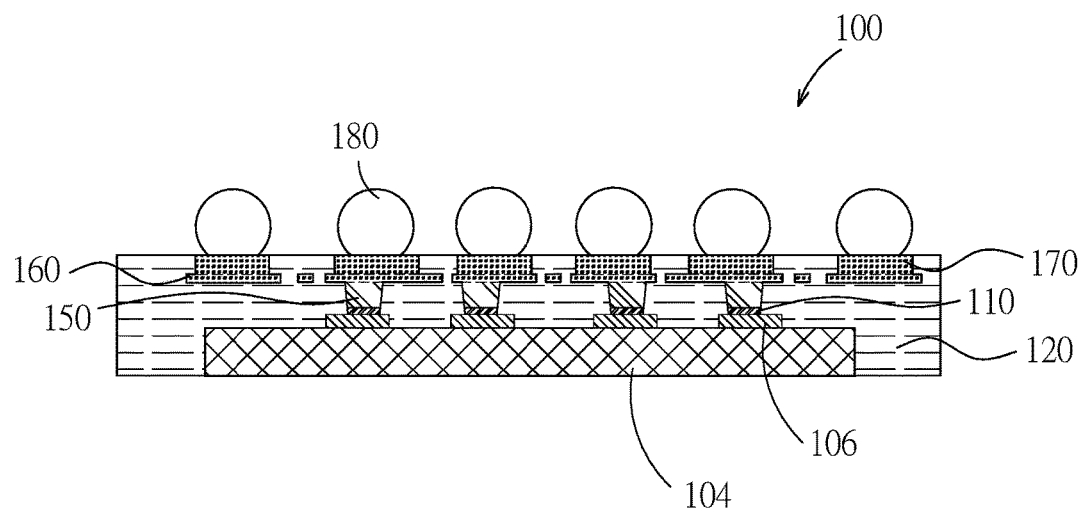
FIGS. 18 and 19 are cross-section diagrams of the semiconductor electrical connection structure fabricated according to the sixth and the seventh embodiments of the invention.
Figure 19:
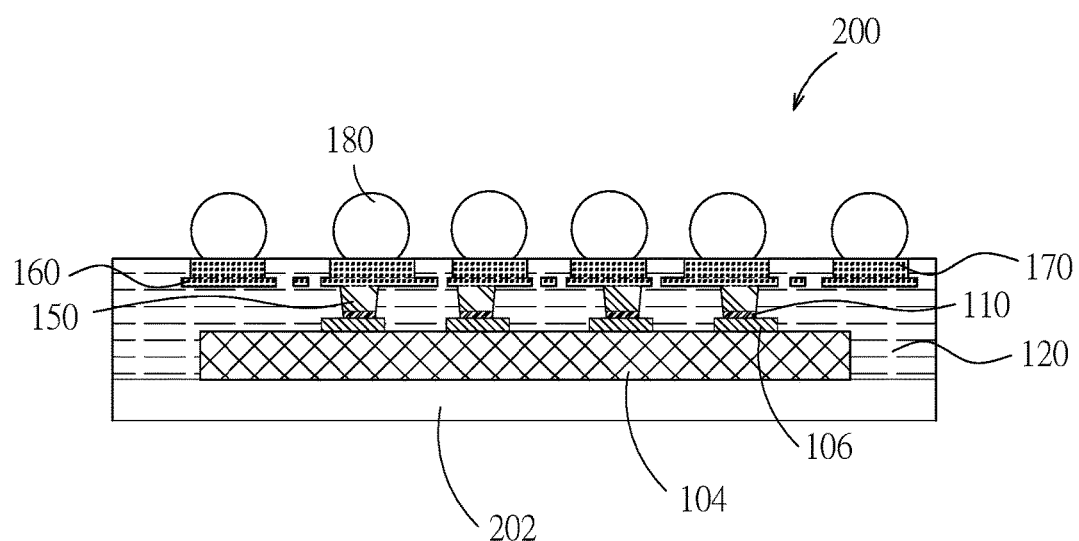

In the future, a circuit layer-adding process can be executed above the dielectric layer 120 and the RDL 160 based on the actual electrical design demand in the present invention, to form external tin ball for the purpose of forming semiconductor package structure of multilayer circuits. FIGS. 18 and 19 are diagrammatic cross-sections of semiconductor electrical connection structure fabricated according to the sixth to the seventh embodiments. As shown in FIGS. 18 and 19, the circuit layer-adding process is additionally executed on the dielectric layer 120 and the RDL 160 in the present embodiment, to form an adding RDL 170 and at least one external tin ball 180 for the purpose of forming fan-out semiconductor package structures 100 and 200. In the sixth embodiment, it is the independent semiconductor package structure 100 after removing the integrated carrier 102, while in the seventh embodiment, the semiconductor package structure 200 includes bearing the semiconductor chip 104 with a metal plate 202.

As mentioned above, the present invention adopts the electroless plating mode to form self-aligned UBM structure directly on metal electrode pad of semiconductor chip, therefore, it can simplify the electrical connection machining process of semiconductor chip, is easily implemented, and can reduce high-cost processes like electroplating and patterning, thereby, to achieve the role of reducing fabrication cost. In addition, the present invention adopts the panel type process, therefore, it can greatly promote the process yield and efficiency.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A method for fabricating a bump structure on a chip with panel type process, comprising in sequential order:
    providing an integrated carrier and a plurality of semiconductor chips, which has an active side and a reverse side relative to the active side, the active side of each semiconductor chip has a plurality of metal electrode pads and an insulated protecting layer, which is exposed out of the metal electrode pads;
    fixing the reverse side of each semiconductor chip on the integrated carrier;
    executing an electroless plating process to form an under bump metallurgy (UBM) structure on the metal electrode pad of each semiconductor chip, wherein the coverage range of the UBM structure is equal to the coverage range of the metal electrode pad;
    forming a dielectric layer to cover the integrated carrier, the semiconductor chips and the UBM structure;

forming a plurality of via holes through the dielectric layer and are exposed out of the UBM structure by laser drill or lithography including exposure and development processes; and forming a plurality of metal bumps in the corresponding via hole of the dielectric layer, respectively;

wherein the electrode pad is an aluminum metal electrode pad, and the electroless plating process includes an electroless nickel plating process, a first electroless gold plating process, an electroless palladium plating process and a second electroless gold plating process that is forming a nickel metal layer on the aluminum metal electrode pad, forming a first gold metal layer on the nickel metal layer, forming a palladium metal layer on the first gold metal layer and forming a second gold metal layer on the palladium metal layer; and wherein the order of arrangement from below is respectively the aluminum metal electrode pad, the nickel metal layer, the first gold metal layer, the palladium metal layer, the second gold metal layer and the metal bump.

2. The method defined in claim 1, wherein the electrode pad is a copper metal electrode pad, and the electroless plating process includes an electroless copper plating process that is forming a copper metal layer on the cooper metal electrode pad.

3. The method defined in claim 2, wherein the order of arrangement from below is respectively the copper metal electrode pad, the copper metal layer and the metal bump.

4. The method defined in claim 1, wherein the electrode pad is an aluminum metal electrode pad, and the electroless plating process includes an electroless copper plating process that is forming a copper metal layer on the aluminum metal electrode pad.

5. The method defined in claim 4, wherein the order of arrangement from below is respectively the aluminum metal electrode pad, the copper metal layer and the metal bump.

6. The method defined in claim 1, wherein the electrode pad is an aluminum metal electrode pad, and the electroless plating process includes an electroless nickel plating process and an electroless copper plating process that is forming a nickel metal layer on the aluminum metal electrode pad and forming a copper metal layer on the nickel metal layer.

7. The method defined in claim 6, wherein the order of arrangement from below is respectively the aluminum metal electrode pad, the nickel metal layer, the copper metal layer and the metal bump.

8. The method defined in claim 1, wherein the electrode pad is an aluminum metal electrode pad, and the electroless plating process includes a first electroless gold plating process, an electroless palladium plating process and a second electroless gold plating process that is forming a first gold metal layer on the aluminum metal electrode pad, forming a palladium metal layer on the first gold metal layer and forming a second gold metal layer on the palladium metal layer.

9. The method defined in claim 8, wherein the order of arrangement from below is respectively the aluminum metal electrode pad, the first gold metal layer, the palladium metal layer, the second gold metal layer and the metal bump.

10. The method defined in claim 1, further comprising:
forming a patterned dry film on the dielectric layer, wherein the patterned dry film includes a plurality of dry film openings to expose the via holes, the UBM structure and apportion of the dielectric layer.

11. The method defined in claim 10, wherein the step of forming the metal bump includes forming the metal bumps in the via holes and the dry film openings.

12. The method defined in claim 1, further comprising:
forming a redistribution layer on the metal bumps, wherein the redistribution layer is electrically connected to the metal electrode pads of the semiconductor chips through the metal bumps and the UBM structure.

* * * * *